(12) United States Patent
Tsukamoto

(10) Patent No.: US 7,951,275 B2
(45) Date of Patent: May 31, 2011

(54) SPUTTERING TARGET AND METHOD FOR FINISHING SURFACE OF SUCH TARGET

(75) Inventor: Shiro Tsukamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 975 days.

(21) Appl. No.: 10/566,301

(22) PCT Filed: Aug. 24, 2004

(86) PCT No.: PCT/JP2004/012083
§ 371 (c)(1),
(2), (4) Date: Jan. 25, 2006

(87) PCT Pub. No.: WO2005/026407
PCT Pub. Date: Mar. 24, 2005

(65) Prior Publication Data
US 2007/0108046 A1    May 17, 2007

(30) Foreign Application Priority Data
Sep. 12, 2003    (JP) .................................. 2003-321050

(51) Int. Cl.
    *C23C 14/06*    (2006.01)
(52) U.S. Cl. ......... 204/298.12; 204/192.12; 204/298.31; 204/298.32
(58) Field of Classification Search ............. 204/298.12, 204/298.32, 19.12, 298.322
    See application file for complete search history.

(56) References Cited

U.S. PATENT DOCUMENTS

| | | | |
|---|---|---|---|
| 5,632,869 A * | 5/1997 | Hurwitt et al. ........... 204/192.12 |
| 5,687,600 A | 11/1997 | Emigh et al. | |
| 6,139,701 A * | 10/2000 | Pavate et al. ............. 204/192.17 |
| 6,153,315 A * | 11/2000 | Yamakoshi et al. .......... 428/687 |
| 6,283,357 B1 * | 9/2001 | Kulkarni et al. .............. 228/155 |
| 6,342,133 B2 | 1/2002 | D'Couto et al. | |
| 6,887,356 B2 | 5/2005 | Ford et al. | |
| 2002/0079217 A1* | 6/2002 | Buehler .................. 204/298.12 |
| 2004/0222088 A1* | 11/2004 | Subramani et al. ...... 204/298.12 |
| 2004/0245099 A1 | 12/2004 | Hukushima | |

FOREIGN PATENT DOCUMENTS

WO    00/32347 A1    6/2000

OTHER PUBLICATIONS

Ryo Suzuki et al., "Development Trend of Sputtering Materials", Electronic Materials, vol. 41, Issue 7, pp. 44-48, Jul. 1, 2002.

Shiro Tsukamotot et al., "Reconsidering Processing Technology from Materials—Unique High-Melting Point Metals of Various Materials Viewed from Work Materials", Machine Technology, vol. 50, Issue 13, pp. 60-61, Dec. 1, 2002.

ESP@CENET Database, English Abstract of JP 2001-316808, Nov. 16, 2001.

ESP@CENET Database, English Abstract of JP 2000-256843, Sep. 19, 2000.

ESP@CENET Database, English Abstract of JP 04-304367, Oct. 27, 1992.

* cited by examiner

*Primary Examiner* — Nam X Nguyen
*Assistant Examiner* — Jason M Berman
(74) *Attorney, Agent, or Firm* — Howson & Howson LLP

(57) ABSTRACT

Provided is a hollow cathode sputtering target comprising an inner bottom face having a surface roughness of $Ra \leq 1.0\ \mu m$, and preferably $Ra \leq 0.5\ \mu m$. This hollow cathode sputtering target has superior sputter film evenness (uniformity), generates few arcing and particles, is capable of suppressing the peeling of the redeposited film on the bottom face, and has superior deposition characteristics.

15 Claims, 2 Drawing Sheets

UNIFORMITY

PARTICLES

UNIFORMITY

PARTICLES

SPUTTERING TARGET AND METHOD FOR FINISHING SURFACE OF SUCH TARGET

BACKGROUND OF THE INVENTION

The present invention relates to a hollow cathode sputtering target which generates few particles and which has superior surface cleansability, and to a surface finishing method of this target.

BACKGROUND ART

In recent years, the sputtering method for forming a film from materials such as metal or ceramics has been used in numerous fields such as electronics, corrosion resistant materials and ornaments, catalysts, as well as in the manufacture of cutting/grinding materials and abrasion resistant materials.

Although the sputtering method itself is a well-known method in the foregoing fields, recently, particularly in the electronics field, a sputtering target suitable for forming films of complex shapes and forming circuits is in demand.

Under these circumstances, a hollow cathode sputtering target has been proposed recently. This target is formed in the shape of a cup, and is referred to as a hollow cathode sputtering target based on such shape (e.g., refer to Patent Documents 1, 2, 3).

With this hollow cathode sputtering target, high density plasma can be generated within the target, and, by further providing directivity in the sputtering direction, a via hole can be filled at a high aspect ratio without having to use a conventional collimator.

As described above, a hollow cathode sputtering target has a function of a deposition method that is effective and easier to control in comparison to a conventional planar target.

Generally speaking, on the inside of a hollow cathode sputtering target, there are an erosion area to where a target is sputtered and a deposition area to where the sputtered atoms are deposited.

Ordinarily, a deposition area is formed at the bottom face, and there is a significant problem in that the redeposited film will easily peel in the vicinity of the deposition area, and contaminate the substrate by flying to or dropping on the substrate.

Generally, when using a planar target, the erosion face of the target is cleansed, the work-affected layer is removed and the surface roughness is reduced so as to suppress the generation of particles.

Meanwhile, when there is a target face or peripheral equipment that is not eroded, contrarily, a measure is adopted such as roughening the surface so as to capture the physical matter that comes flying from the target during sputtering (e.g., refer to Patent Document 4, 5, 6).

Patent Document 1: Japanese Patent Laid-Open Publication No. 2000-256843
Patent Document 2: Japanese Patent Laid-Open Publication No. 2001-98367
Patent Document 3: Publication No. 2002-531690 of Translation of International Application
Patent Document 4: Japanese Patent Laid-Open Publication No. H4-304367
Patent Document 5: Japanese Patent Laid-Open Publication No. H11-1766
Patent Document 6: Japanese Patent Laid-Open Publication No. H173965

Nevertheless, this kind of technology was applied in a hollow cathode sputtering target to roughen the bottom face of the target so as to prevent the peeling of the deposited material (redeposited film), but was unsuccessful. Contrarily, at the stage of commencing the sputtering process, the result was such that the uniformity of deposition was unstable, and numerous particles were generated.

Therefore, there was no choice but to use a conventional hollow cathode sputtering target, and there are problems in that the evenness (uniformity) of the film is inferior, arcing and particles are generated, and the quality of the sputtered deposition will deteriorate.

SUMMARY OF THE INVENTION

Thus, an object of the present invention is to provide a hollow cathode sputtering target which has superior sputter film evenness (uniformity), generates few arcing and particles, is capable of suppressing the peeling of the redeposited film on the bottom face, and has superior deposition characteristics, as well as a method for stably manufacturing this target.

In order to achieve the foregoing object, the present inventors discovered that by improving/devising the inner bottom face of the hollow cathode sputtering target, a hollow cathode sputtering target which has superior sputter film evenness (uniformity), generates few arcing and particles, is capable of suppressing the peeling of the redeposited film on the bottom face, and has superior deposition characteristics, as well as a method for stably manufacturing this target, could be obtained.

Based on the foregoing discovery, the present invention provides:

1. A hollow cathode sputtering target comprising an inner bottom face having a surface roughness of $Ra \leqq = 1.0$ μm, preferably $Ra \leqq 0.5$ μm.
2. The hollow cathode sputtering target according to paragraph 1, comprising a bottom face having a surface roughness Ra equal to or less than a cylindrical inner peripheral face;
3. The hollow cathode sputtering target according to any one of paragraph 1 or paragraph 2 above, comprising a rough face at the outer peripheral edge;
4. The hollow cathode sputtering target according to paragraph 3 above, comprising a rough face formed by performing abrasive blasting to the outer peripheral edge;
5. The [hollow cathode] sputtering target according to any one of paragraphs 1 to 4 above, wherein the target is formed from a cladding material;
6. A surface finishing method of a hollow cathode sputtering target characterizing in polishing and etching the bottom face of the target so as to make the surface roughness of the inner bottom face $Ra \leqq 1.0$ μm, preferably $Ra \leqq 0.5$ μm The present invention yields a superior effect in that it is able to stably obtain a hollow cathode sputtering target which has superior film evenness (uniformity) from the initial stages of sputtering, generates few arcing and particles, is superior deposition characteristics, and favorable target usability.

Further, there is another significant effect of being able to considerably reduce the peeling of the redeposited from the inner bottom face of a hollow cathode target which was in particular a problem heretofore.

DETAILED DESCRIPTION OF THE INVENTION

The hollow cathode sputtering target of the present invention can be applied to ceramics of various metals, alloys, silicides and oxides, but there is no particular limitation to the material. In order to manufacture a hollow body (cup shape), processing methods such as forging, flattening, rolling, deep drawing or the like are employed. There is also no particular limitation to this manufacturing method.

Upon manufacture, what is particularly important is the surface finishing of the inside of the target. In other words, after forming the hollow cathode sputtering target, it is important to subject the bottom face of the target to lathe processing, polishing and etching so as to make the surface roughness of the bottom face Ra≦1.0 μm, preferably Ra≦0.5 μm.

With a sputtering target comprising an inner bottom face having a surface roughness of Ra≦1.0 μm, preferably Ra≦0.5 μm, in particular, it is desirable to comprise a bottom face having a surface roughness Ra equal to or less than the cylindrical inner peripheral face.

Meanwhile, it is also desirable that the erosion face also has a surface roughness of at least Ra≦1.0 μm, preferably Ra≦0.5 μm.

Further, the outer peripheral edge or outer peripheral face of the hollow cathode sputtering target is a non-erosion face, and it is desirable that such edge or face has a rough face. This will usually become a getter for capturing particles.

The hollow cathode sputtering target may be a single body, or the target may be formed from a cladding material. The inner bottom face of the hollow cathode sputtering target is required to have the same surface roughness as above; namely, Ra≦1.0 μm, preferably Ra≦0.5 μm.

Although a curved face exists at the boundary of the bottom face and cylindrical inner face of the hollow cathode target, in the present invention, it is desirable that such curved portion is also polished such that the surface roughness of the surface thereof become Ra≦1.0 μm, preferably Ra≦0.5 μm.

EXAMPLES

The present invention is now explained in detail with reference to the Examples. Incidentally, these Examples are merely illustrative, and the present invention shall in no way be limited thereby. In other words, the present invention shall include the various modes and modifications contained in the technical spirit of this invention.

Example 1

Figure 1:
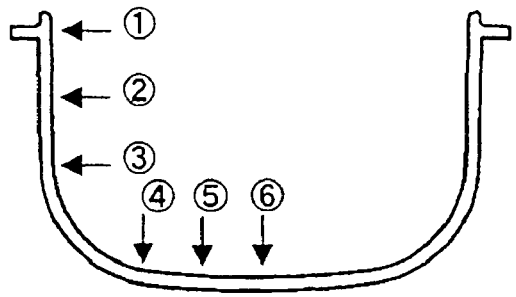
FIG. 1 is a schematic diagram of the cross section and planar surface of the hollow cathode sputtering target showing the respective measurement points of the surface roughness.

The inside face of a Ti hollow cathode target was finished by being subject to lathe processing, polishing (sandpapering) and etching. The outline of the obtained hollow cathode sputtering target is shown in FIG. 1. The measurement of the surface roughness of the target was conducted at the respective measurement points (1 to 6) shown in FIG. 1.

Table 1 shows the surface roughness Ra (μm) of the inside of the target. As shown in Table 1, the surface roughness Ra of the bottom face corresponding to the measurement points 1 to 6 is 0.5% m or less, and the surface roughness Ra of the cylindrical inner peripheral face was also 0.5 μm or less.

Figure 2:
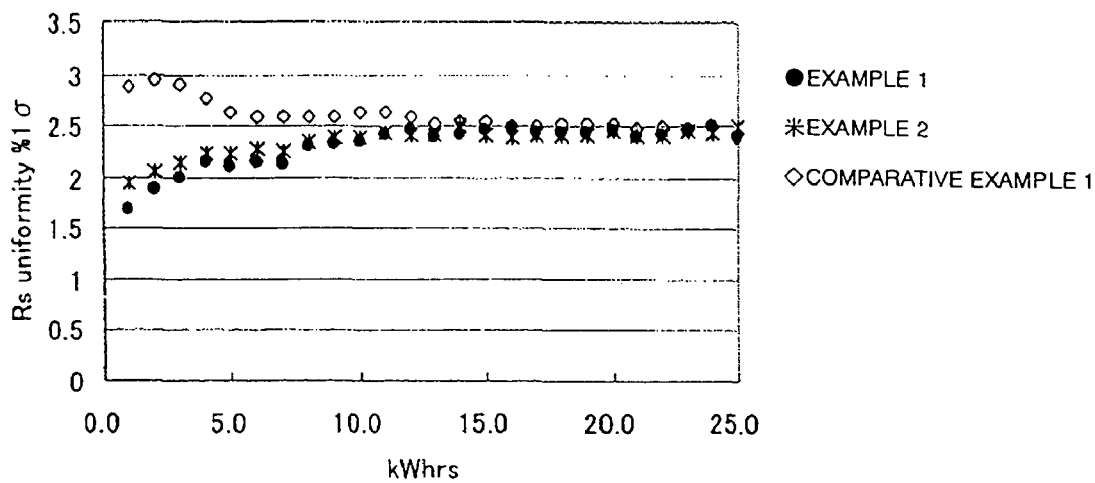
FIG. 2 is a diagram showing the uniformity upon sputtering a hollow cathode Ti target.
Figure 3:
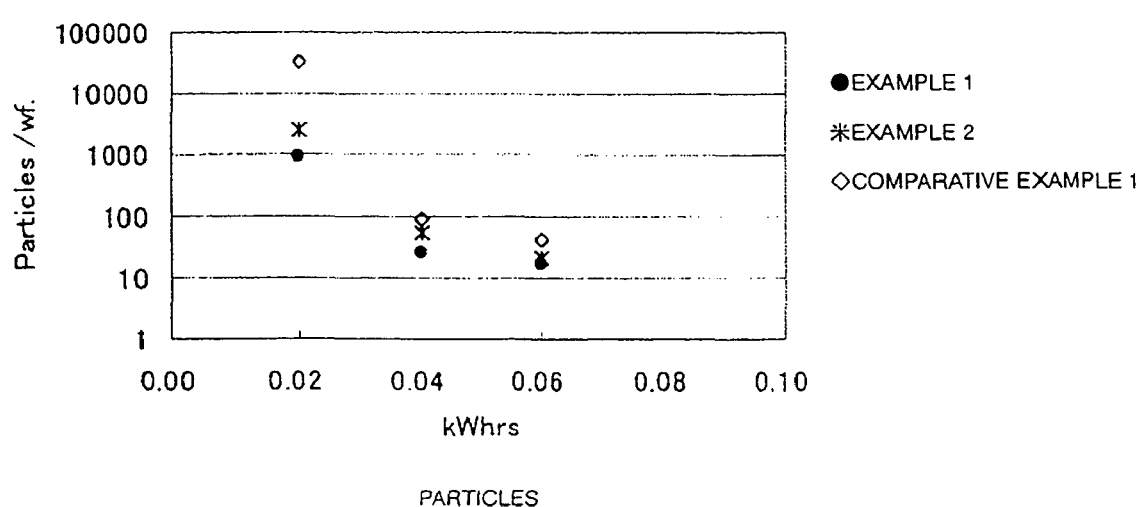
FIG. 3 is a diagram showing the generation of particles upon sputtering a hollow cathode Ti target.

The results upon performing a sputtering test with this hollow cathode target are shown in FIG. 2 and FIG. 3. The uniformity showed favorable values from the initial stage, and there were roughly 900 particles on a single wafer. Further, peeling of the redeposited film of the inner bottom could not be observed up to the expected useful life.

TABLE 1

|     | Example 1 | Example 2 | Comparative Example 1 | Example 3 | Example 4 | Comparative Example 2 |
| --- | --- | --- | --- | --- | --- | --- |
| (1) | 0.4 | 0.7 | 1.7 | 0.5 | 0.8 | 3.5 |
| (2) | 0.4 | 0.8 | 1.7 | 0.5 | 0.9 | 2.3 |
| (3) | 0.4 | 0.8 | 1.0 | 0.4 | 0.8 | 2.0 |
| (4) | 0.4 | 0.7 | 2.1 | 0.5 | 0.7 | 2.6 |
| (5) | 0.3 | 0.7 | 2.5 | 0.4 | 0.8 | 2.4 |
| (6) | 0.4 | 0.8 | 1.3 | 0.5 | 1.0 | 3.5 |

Ra(μm)

Example 2

The inside face of a Ti hollow cathode target was finished by being subject to lathe processing, polishing (sandpapering) and etching so as to be Ra (μm)<1.0.

As with Example 1, the measurement of the surface roughness of the target was conducted at the respective measurement points (1 to 6) shown in FIG. 1. The results are similarly shown in Table 1.

As shown in Table 1, the surface roughness Ra of the bottom face corresponding to the measurement points 1 to 6 is 1.0 μm or less, and the surface roughness Ra of the cylindrical inner peripheral face was also 1.0 μm or less.

The results upon performing a sputtering test with this hollow cathode target are shown in FIG. 2 and FIG. 3. As shown in FIG. 2, the uniformity showed favorable values from the initial stage. Also, as shown in FIG. 3, there were roughly 2,500 particles on a single wafer. Further, peeling of the redeposited film at the bottom of the inside face could not be observed up to the expected useful life.

Comparative Example 1

The inside face of a Ti hollow cathode target was finished with only lathe processing. As with Example 1, the measurement of the surface roughness of the target was conducted at the respective measurement points (1 to 6) shown in FIG. 1.

Similarly, the surface roughness Ra (μm) of the inside face of the target is shown in Table 1. As shown in Table 1, the surface roughness corresponding to the measurement points 1 to 6 was bottom face Ra=1.3 to 2.5 μm, and side face Ra=1.0 to 1.7 μm.

Results of the sputtering test are related to Examples 1 and 2, and the measurement results of uniformity and the number of particles are shown in FIG. 2 and FIG. 3.

As shown in FIG. 2 and FIG. 3, the uniformity is inferior from the initial stage, and the number of particles on a single wafer was larger in comparison to Examples 1 and 2 at 25,000 particles. Further, after the use of roughly 8000 kWhr, peeling of the redeposited layer on the bottom of the inside face was confirmed.

Example 3

The inside face of a Ta hollow cathode target was finished by being subject to lathe processing, polishing (sandpapering) and etching. As with Example 1, the measurement of the surface roughness of the target was conducted at the respective measurement points (1 to 6) shown in FIG. 1.

The surface roughness Ra (μm) of the inside face of the target is shown in Table 1. As shown in Table 1, the surface roughness Ra at the measurement points 1 to 6 was 0.4 to 0.5 μm.

Figure 4:
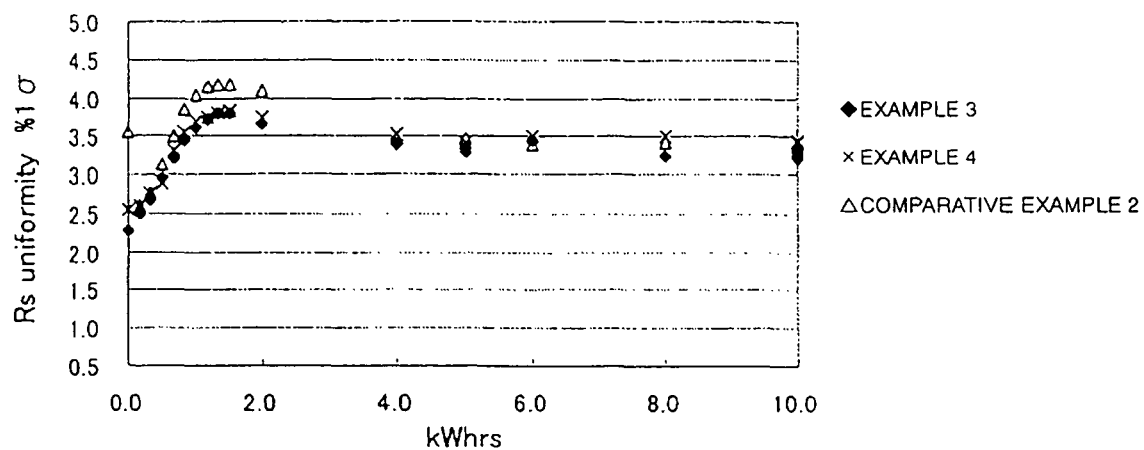
FIG. 4 is a diagram showing the uniformity upon sputtering a hollow cathode Ta target.
Figure 5:
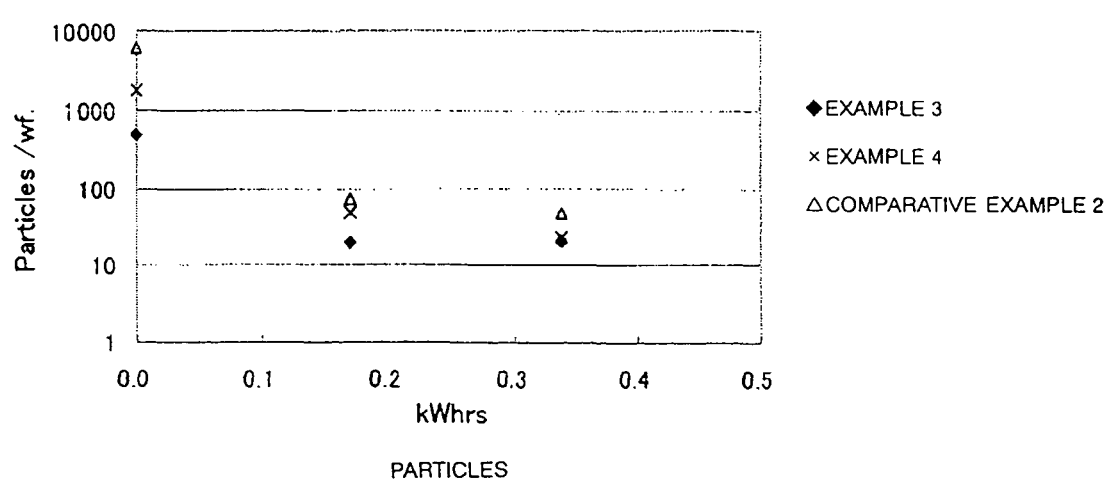
FIG. 5 is a diagram showing the generation of particles upon sputtering a hollow cathode Ta target.

As a result of performing a sputtering test with this hollow cathode target, as shown in FIG. 4, the uniformity showed favorable values from the initial stage. Also, as shown in FIG. 5, there were roughly 500 particles on a single wafer. Further, peeling of the redeposited film at the bottom of the inside face could not be observed up to the expected useful life.

Example 4

The inside face of a Ta hollow cathode target was finished by being subject to lathe processing, polishing and etching. As with Example 1, the measurement of the surface roughness of the target was conducted at the respective measurement points (1 to 6) shown in FIG. 1.

The surface roughness Ra (μm) of the inside face of the target is shown in Table 1. As shown in Table 1, the surface roughness Ra at the measurement points 1 to 6 was 0.7 to 1.0 μm.

As a result of performing a sputtering test with this hollow cathode target, as shown in FIG. 4, the uniformity showed favorable values from the initial stage. Also, as shown in FIG. 5, there were roughly 1,800 particles on a single wafer. Further, peeling of the redeposited film at the bottom of the inside face could not be observed up to the expected useful life.

Comparative Example 2

The inside face of a Ta hollow cathode target was finished with only lathe processing. As with Example 1, the measurement of the surface roughness of the target was conducted at the respective measurement points (1 to 6) shown in FIG. 1.

Similarly, the surface roughness Ra (μm) of the inside face of the target is shown in Table 1. As shown in Table 1, the surface roughness corresponding to the measurement points 1 to 6 was bottom face Ra=2.4 to 3.5 μm, and side face Ra=2.0 to 3.5 μm.

Results of the sputtering test are related to Examples 3 and 4, and the measurement results of uniformity and the number of particles are shown in FIG. 4 and FIG. 5.

As shown in FIG. 4 and FIG. 5, the uniformity is inferior from the initial stage, and the number of particles on a single wafer was larger in comparison to Examples 3 and 4 at 6,000 particles. Further, peeling of the redeposited layer on the bottom of the inside face was confirmed after the expected useful life.

Industrial Applicability

The present invention is advantageous in that the function of a hollow cathode sputtering target can be further improved since a target which has superior sputter film evenness (uniformity), generates few arcing and particles, is capable of suppressing the peeling of the redeposited film on the bottom face, and has superior deposition characteristics can be manufactured.

The invention claimed is:

1. A hollow cathode sputtering target comprising an inner bottom face that forms a non-erosion portion of a plastic-worked hollow cathode sputtering target and a cylindrical inner peripheral face that forms an erosion portion of the plastic-worked hollow cathode sputtering target, wherein, upon manufacture, a surface roughness (Ra) of said inner bottom face of said non-erosion portion of the plastic-worked hollow cathode sputtering target being Ra=1.0 μm and being less than a surface roughness (Ra) of said cylindrical inner peripheral face of said erosion portion of the plastic-worked hollow cathode sputtering target.

2. A surface finishing method of a hollow cathode sputtering target comprising the steps of forming a hollow body of the hollow cathode sputtering target via plastic working, and, after said plastic working, polishing and etching an inner bottom face of the target that forms a non-erosion portion of the hollow cathode sputtering target so as to make the surface roughness (Ra) of the inner bottom face, upon manufacture, Ra=1.0 μm and less than a surface roughness (Ra) of a cylindrical inner peripheral face of the hollow cathode sputtering target that forms an erosion portion of the hollow cathode sputtering target.

3. A hollow cathode sputtering target according to claim 1, wherein said surface roughness of said inner bottom face of said non-erosion portion of the hollow cathode sputtering target is Ra=0.5 μm.

4. A hollow cathode sputtering target according to claim 3, wherein said target has an outer peripheral edge with a rough face and wherein said outer peripheral edge forms part of said non-erosion portion of the hollow cathode sputtering target.

5. A hollow cathode sputtering target according to claim 4, wherein said rough face of said outer peripheral edge is an abrasive blasted face.

6. A hollow cathode sputtering target according to claim 5, wherein said hollow cathode sputtering target is formed from a cladding material.

7. A hollow cathode sputtering target according to claim 1, wherein said target has an outer peripheral edge with a rough face and wherein said outer peripheral edge forms part of said non-erosion portion of the hollow cathode sputtering target.

8. A hollow cathode sputtering target according to claim 7, wherein said rough face of said outer peripheral edge is an abrasive blasted face.

9. A hollow cathode sputtering target according to claim 8, wherein said hollow cathode sputtering target is formed from a cladding material.

10. A hollow cathode sputtering target according to claim 1, wherein said hollow cathode sputtering target is formed from a cladding material.

11. A method according to claim 2, wherein said surface roughness of said inner bottom face is made to be Ra=0.5 μm during said polishing and etching step.

12. A hollow cathode sputtering target, consisting of:
a cup-shaped body having an inner peripheral surface defining a hollow cavity within the cup-shaped body and an outer peripheral surface on an exterior of said cup-shaped body, said inner peripheral surface being a sputtering face of said cup-shaped body and said outer peripheral face being a non-erosion face;
said inner peripheral surface consisting of a cylindrical peripheral face, a bottom face, and a curved face defining a boundary between said cylindrical face and said bottom face, said cylindrical peripheral face forming an erosion area of said sputtering face that is eroded during a sputtering operation when a high density plasma is generated within the hollow cavity of the cup-shaped body, and said bottom face forming a non-erosion portion of said cup-shaped body;
a surface roughness (Ra) of said bottom face, upon manufacture, being Ra=1.0 μm and being less than a surface roughness (Ra) of said cylindrical inner peripheral face.

13. A hollow cathode sputtering target according to claim 12, wherein said surface roughness of said bottom face is Ra=0.5 μm.

14. A hollow cathode sputtering target according to claim 12 wherein said cup-shaped body is made of titanium (Ti).

15. A hollow cathode sputtering target according to claim 12 wherein said cup-shaped body is made of tantalum (Ta).

* * * * *

UNITED STATES PATENT AND TRADEMARK OFFICE
CERTIFICATE OF CORRECTION

PATENT NO. : 7,951,275 B2
APPLICATION NO. : 10/566301
DATED : May 31, 2011
INVENTOR(S) : Shiro Tsukamoto It is certified that error appears in the above-identified patent and that said Letters Patent is hereby corrected as shown below:

Column 6, line 3, "Ra=;" should read "Ra$\leq$"

Column 6, line 14, "Ra=;" should read "Ra$\leq$"

Column 6, line 22, "Ra=;" should read "Ra$\leq$"

Column 6, line 47, "Ra=;" should read "Ra$\leq$"

Column 6, line 66, "Ra=;" should read "Ra$\leq$"

Column 7, line 3, "Ra=;" should read "Ra$\leq$"

Signed and Sealed this
First Day of November, 2011

David J. Kappos
*Director of the United States Patent and Trademark Office*